(12) United States Patent
Fukasawa et al.

(10) Patent No.: US 6,914,267 B2
(45) Date of Patent: Jul. 5, 2005

(54) LIGHT EMITTING DIODE

(75) Inventors: Koichi Fukasawa, Yamanashi (JP); Junji Miyashita, Fujiyoshida (JP); Kousuke Tsuchiya, Fujiyoshida (JP)

(73) Assignee: Citizen Electronics Co. Ltd., Yamanashi (JP)

( * ) Notice: Subject to any disclaimer, the term of this patent is extended or adjusted under 35 U.S.C. 154(b) by 0 days.

(21) Appl. No.: 10/817,895

(22) Filed: Apr. 6, 2004

(65) Prior Publication Data

US 2004/0188700 A1 Sep. 30, 2004

Related U.S. Application Data

(63) Continuation of application No. 09/763,421, filed as application No. PCT/JP00/04006 on Jun. 20, 2000.

(30) Foreign Application Priority Data

| Jun. 23, 1999 | (JP) | .......................................... | 11-176350 |
| Jul. 7, 1999 | (JP) | .......................................... | 11-193441 |
| Jul. 19, 1999 | (JP) | .......................................... | 11-204623 |

(51) Int. Cl.[7] .............................................. H01L 29/22
(52) U.S. Cl. .............................. 257/98; 257/95; 257/99; 257/100
(58) Field of Search .............................. 257/95, 98, 99, 257/100, 432

(56) References Cited

U.S. PATENT DOCUMENTS

| 3,875,456 A | 4/1975 | Kano et al. |
| 4,152,624 A | 5/1979 | Knaebel |

(Continued)

FOREIGN PATENT DOCUMENTS

| EP | 0 936 682 A1 | 8/1999 | | |
| JP | 63-225153 | 9/1988 | | |
| JP | 01036036 A | * 2/1989 | .......... | H01L/21/52 |
| JP | 64-036036 | 2/1989 | | |
| JP | 11-283883 | 11/1989 | | |
| JP | H4-63661 | 5/1992 | | |
| JP | 05-063239 | 3/1993 | | |
| JP | 07-235696 | 9/1995 | | |
| JP | 07235696 A | * 9/1995 | .......... | H01L/33/00 |
| JP | 07-288341 | 10/1995 | | |
| JP | 07288341 A | * 10/1995 | .......... | H01L/33/00 |
| JP | 10-242526 | 9/1996 | | |
| JP | 09-321341 | 12/1997 | | |
| JP | 09-321343 | 12/1997 | | |
| JP | 10-151794 | 6/1998 | | |
| JP | 10-163526 | 6/1998 | | |
| JP | 10-242513 | 9/1998 | | |
| JP | 10-290029 | 10/1998 | | |
| JP | 11-031845 | 2/1999 | | |
| JP | 11-046018 | 2/1999 | | |
| JP | 11-046019 | 2/1999 | | |
| JP | 11-068166 | 3/1999 | | |
| JP | 11-068169 | 3/1999 | | |
| JP | 11-087778 | 3/1999 | | |
| JP | 11-087784 | 3/1999 | | |

*Primary Examiner*—George Eckert
*Assistant Examiner*—Eugene Lee
(74) *Attorney, Agent, or Firm*—Browdy and Neimark, P.L.L.C.

(57) ABSTRACT

A light emitting diode comprising a light emitting diode element 20 mounted on a glass epoxy substrate 12, this light emitting diode element 20 being protected at its surface side by a resin seal member 33, in which: a light emitting diode element for blue luminescence, formed of gallium nitride type compound semiconductor is used as the above-mentioned light emitting diode element 20; and a fluorescent material containing layer 21 composed of a fluorescent material containing layer 21 composed of a fluorescent material dispersed into an adhesive is arranged on the back side of this light emitting diode element. On the back side of the light emitting diode element 20, blue luminescence is converted in wavelength to produce white luminescence of high intensity.

3 Claims, 12 Drawing Sheets

U.S. PATENT DOCUMENTS

| | | |
|---|---|---|
| 4,780,752 A | 10/1988 | Angerstein et al. |
| 5,098,630 A | 3/1992 | Ogiu et al. |
| 5,798,170 A | 8/1998 | Zhang et al. |
| 5,836,676 A | 11/1998 | Ando et al. |
| 5,847,507 A | 12/1998 | Butterworth et al. |
| 5,942,770 A | 8/1999 | Ishinaga et al. |
| 5,966,393 A | 10/1999 | Hide et al. |
| 6,054,716 A | 4/2000 | Sonobe et al. |
| 6,061,160 A | 5/2000 | Maruyama |
| 6,069,440 A | 5/2000 | Shimizu et al. |
| 6,121,637 A | 9/2000 | Isokawa et al. |
| 6,274,890 B1 | 8/2001 | Oshio et al. |
| 6,299,498 B1 | 10/2001 | Liu et al. |
| 6,310,364 B1 * | 10/2001 | Uemura ............... 257/100 |
| 6,319,425 B1 | 11/2001 | Tasaki et al. |
| 6,340,824 B1 | 1/2002 | Komoto et al. |
| 6,600,175 B1 * | 7/2003 | Baretz et al. ............. 257/100 |
| 6,642,547 B2 * | 11/2003 | Matsubara et al. ......... 257/98 |

* cited by examiner

LIGHT EMITTING DIODE

This is a continuation of copending parent application Ser. No. 09/763,421, nationalized Feb. 22, 2001, of which the international application was filed PCT/JP00/04006, filed Jun. 20, 2000.

FIELD OF THE INVENTION

The present invention relates to a light emitting diode of wavelength conversion type, and more particularly to a type of light emitting diode which converts blue luminescence into white.

BACKGROUND OF THE INVENTION

Conventionally, among this kind of light emitting diodes of wavelength conversion type are known the one shown in FIG. 22 (Japanese Patent No. 2900928) and the one shown in FIG. 23 (Japanese Patent Laid-Open Publication No. Hei 7-99345). The former one is a light emitting diode 1 of lead frame type, having a structure in which: a recess 3 is arranged in a metal stem 2, one of the lead frames; a light emitting diode element 4 made of gallium nitride type compound semiconductor is placed on and fixed to this recess 3; and this light emitting diode element 4 is connected with the aforementioned metal stem 2 and a metal post 5, the other lead frame, by using bonding wires 6 and 7, respectively; the whole being sealed by a transparent resin 9 of bombshell form. A fluorescent material 8 for wavelength conversion is dispersed into the transparent resin 9 mentioned above. When the light emitting diode 1 is lit, the light emitted from the light emitting diode element 4 impinges the fluorescent substance 8 and is converted into yellow so that it can blend with the original blue luminescence from the light emitting diode element 4 to present white in luminescent color.

Then, in the latter one, a light emitting diode element 4 for blue luminescence, made of gallium nitride type compound semiconductor is placed on and fixed to a recess 3 in the above-mentioned metal stem 2, and a fluorescent material containing resin 8 is filled into the above-mentioned recess 3 so as to cover the top of this light emitting diode element 4. Accordingly, in the light emitting diode 1 having such a configuration, the blue luminescence emitted from the light emitting diode element 4 excites the fluorescent material in the fluorescent material containing resin 8, and the light converted thus in wavelength blends with the original blue luminescence from the light emitting diode element 4 to come out as white luminescence.

Nevertheless, among the conventional light emitting diodes 1 described above, the former had the problem that since that fluorescent material 8 is dispersed into the transparent resin 9 which seals the light emitting diode element 4, the light passing through the transparent resin 9 drops in transmittance, decreasing the intensity of the white luminescence. It also had the problem that the fluorescent material 8 is higher than the transparent resin 9 in specific gravity and thus is difficult to disperse uniformly, causing chromaticity variations not only between different light emitting diodes but also within a single light emitting diode.

On the other hand, the latter had the problem that since the fluorescent material containing resin 8 covers the vicinity of the top of the light emitting diode element 4, the transmission of the light from the light emitting diode element 4 is hampered by the fluorescent material so that white luminescence of high intensity cannot be obtained.

It is thus an object of the present invention to provde a light emitting diode improved in the intensity of white luminescence and suppressed in chromaticity variations.

DISCLOSURE OF THE INVENTION

A light emitting diode according to the present invention comprises a light emitting diode element mounted on a base, the light emitting diode element being protected at its surface side by a resin seal member, the light emitting diode being characterized in that a fluorescent material containing layer is arranged on the back side of the aforesaid light emitting diode element.

According to this invention, the fluorescent material containing layer is arranged on the back side of the light emitting diode element so that the light from the light emitting diode element is converted in waveform at the back side of the light emitting diode. This eliminates the need for a wavelength-converting fluorescent material to be dispersed into the resin seal member which protects the surface side of the light emitting diode element. Therefore, the resin seal member improves in light transmittance, allowing an increase in the luminescent intensity of the light emitting diode.

Besides, a light emitting diode according to another aspect of the present invention is characterized in that the aforesaid light emitting diode element is a light emitting diode element made of gallium nitride type compound semiconductor or SiC type compound semiconductor.

According to this invention, the fluorescent material containing layer is arranged on the back side of the blue-luminescence light emitting diode element formed of the above-mentioned compound, so that the light from the light emitting diode element is converted in wavelength at the back side of the light emitting diode element. Therefore, white luminescence of high luminescent intensity is obtained.

Moreover, a light emitting diode according to another aspect of the present invention comprises two or more light emitting diode elements mounted on a base, the light emitting diode elements being protected at their surface side by a resin seal member, the light emitting diode being characterized in that: at least one of the aforesaid two or more light emitting diode elements is a light emitting diode element for blue luminescence, made of gallium nitride type compound semiconductor or SiC type compound semiconductor; and a fluorescent material containing layer is arranged on the back side of this light emitting diode element for blue luminescence.

According to this invention, multicolor luminescence including white luminescence can be achieved by simple means Furthermore, a light emitting diode according to another aspect of the present invention is characterized in that: the aforesaid fluorescent material containing layer is composed of a fluorescent material dispersed into an adhesive; and the back of the light emitting diode element is firmly fixed to the base by the adhesive action of this fluorescent material containing layer.

According to this invention, the dispersion of the fluorescent material into the adhesive makes it possible to arrange the fluorescent material simultaneously during the process of adhesive bonding the light emitting diode element.

Beside, a light emitting diode according to another aspect of the present invention is characterized in that; the aforesaid fluorescent material containing layer is formed with a fluorescent material and an adhesive separate from each other; and a fluorescent material containing resin layer and an adhesive layer are formed in layers on the top surface of the base.

According to this invention, the fluorescent material and the adhesive are formed in separate layers on the base. This ensures a greater thickness of the fluorescent material content and facilitates thickness control as well, with the advantage that the degree of blending with blue luminescence is easy to adjust.

Moreover, a light emitting diode according to another aspect of the present invention is characterized in that the aforesaid fluorescent material containing layer is formed on the top surface of the base by printing means.

According to this invention, overprinting can be performed to secure a thickness of the fluorescent material containing layer and control the thickness as well.

Furthermore, a light emitting diode according to another aspect of the present invention is characterized in that the aforesaid fluorescent material containing layer is a fluorescent material containing resin sheet pasted on the top surface of the base.

According to this invention, the thickness of the fluorescent material containing resin sheet can be appropriately adjusted so as to secure a thickness of the fluorescent material containing layer and control the thickness as described above.

Besides, a light emitting diode according to another aspect of the present invention is characterized in that the aforesaid fluorescent material is a yttrium compound.

According to this invention, the use of an yttrium compound for the fluorescent material allows efficient wavelength conversion from visible light of shorter wavelength into visible light of longer wavelength.

Moreover, a light emitting diode according to another aspect of the present invention is characterized in that the periphery of the aforesaid fluorescent material containing layer is surrounded by a dam provided on the top surface of the aforesaid base.

According to this invention, surrounding the periphery of the fluorescent material containing layer by the dam makes it possible to ensure a predetermined thickness of the fluorescent material containing layer, as well as to secure a uniform thickness under the entire bottom surface of the light emitting diode element.

Furthermore, a light emitting diode according to another aspect of the present invention is characterized in that a reflecting surface is arranged on the bottom side of the aforesaid fluorescent material containing layer or the top surface of the base.

According to this invention, a thin film layer of high reflectivity, such as copper foil and aluminum foil, can be arranged on the bottom side of the fluorescent material containing layer so that the yellow luminescence converted in wavelength by the fluorescent material is reflected upward with efficiency.

Besides, a light emitting diode according to another aspect of the present invention is characterized in that an upward reflecting surface tilting outward is arranged around the aforesaid fluorescent material containing layer.

According to this invention, the light emitted in all directions from the light emitting diode element are gathered upward by the reflecting surface, thereby achieving a further improvement in intensity.

Moreover, a light emitting diode according to another aspect of the present invention is characterized in that a lens portion of convex shape if formed on the top side of the aforesaid resin seal member.

According to this invention, because the lens portion of convex shape is formed on the top surface of the resin seal member, light traveling straight through the resin seal member is refracted upward at the interface surface, enhancing the upward light-gathering power.

Furthermore, a light emitting diode according to another aspect of the present invention is characterized in that: the aforesaid resin seal member is formed flat at the top side; and a fluorescent material containing layer is formed on the top side.

According to this invention, the formation of the fluorescent material containing layer on the top side of the resin seal material allows color adjustment on the top side.

Besides, a light emitting diode according to another aspect of the present invention is characterized in that the aforesaid base is a glass epoxy substrate, a solid-molded substrate of liquid crystal polymer, or a sheet metal substrate.

According to this invention, glass epoxy substrates, solid-molded substrates of liquid crystal polymer, and sheet metal substrates can be selected as the base of the light emitting diode.

Moreover, a light emitting diode according to another aspect of the present invention is characterized in that: the aforesaid light emitting diode element is connected to a pair of electrodes arranged on the base; and these electrodes are surface-mounted directly to print wires on a motherboard.

According to this invention, it is a structure best suitable for chip-type light emitting diode of surface mount type and excellent in productivity.

DISCLOSURE OF THE INVENTION

BEST MODE FOR CARRYING OUT THE INVENTION

For further details of the light emitting diode of the present invention, description thereof will be given with reference to the accompanying drawings.

Figure 1:
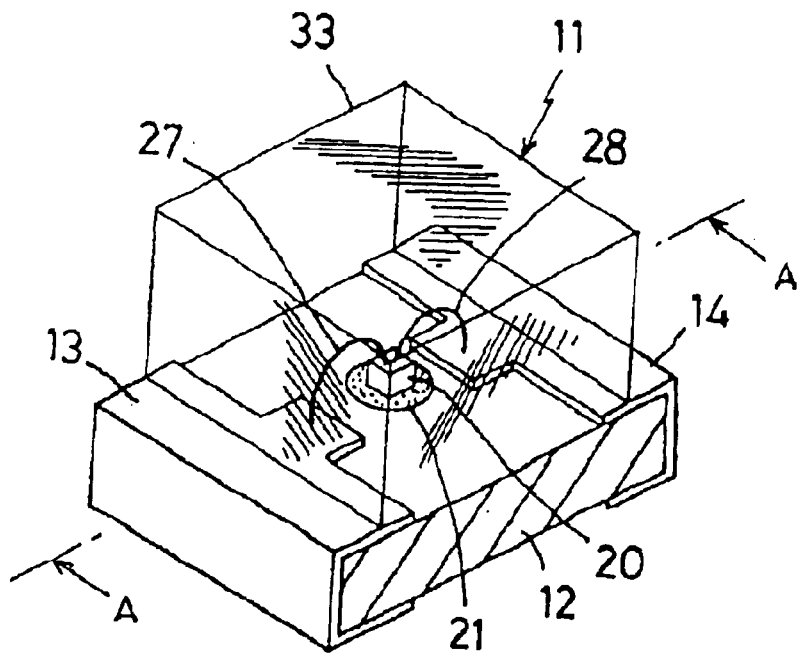
FIG. 1 is a perspective view of a light emitting diode showing a first embodiment of the present invention.
Figure 2:
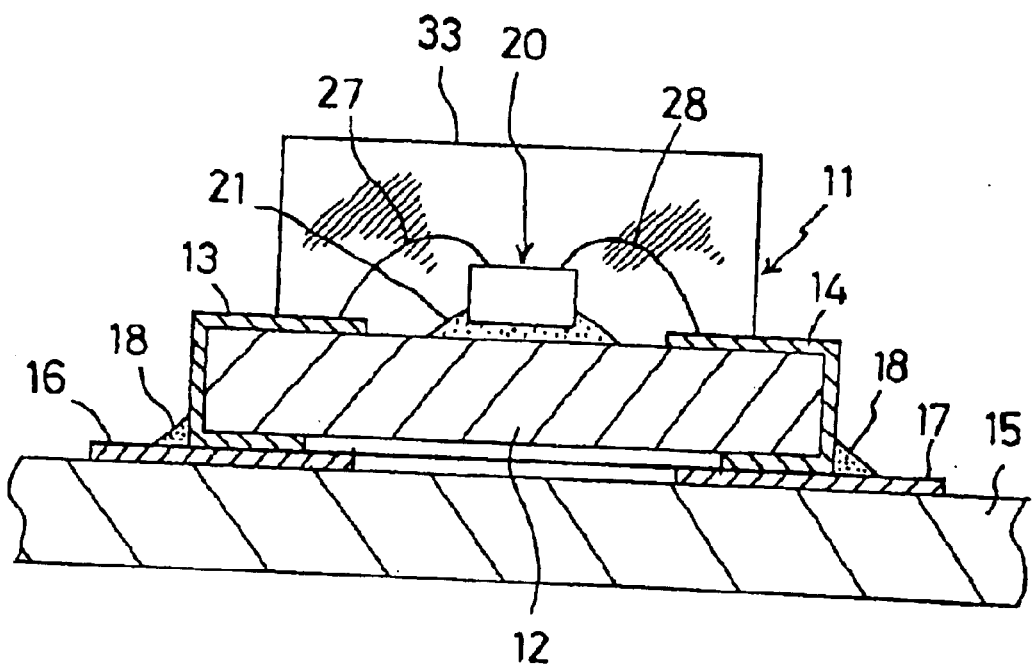
FIG. 2 is a sectional view along the line A—A in FIG. 1, at motherboard mounting.
Figure 3:
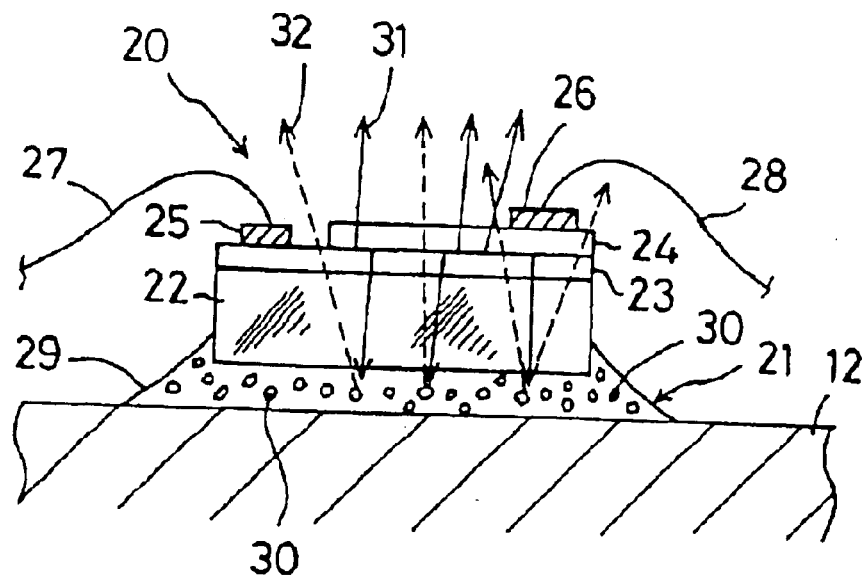
FIG. 3 is a conceptual diagram showing the principle of the wavelength conversion at the back side of the light emitting diode element in the above-mentioned light emitting diode.

FIGS. 1 through 3 show an embodiment in the case of application to a surface mount type light emitting diode. The surface mount type light emitting diode 11 according to this embodiment achieves the surface mounting in such a manner that a pair of topside electrodes 13, 14 (cathode electrode and anode electrode) are patterned with a rectangular glass epoxy substrate (hereinafter, referred to as glass epoxy substrate) 12 as the base, and underside electrodes integrally formed thereto are fixed to printed wires 16 and 17 on a motherboard 15 with solder 18.

A light emitting diode element 20 is mounted on the topside center of the above-mentioned glass epoxy substrate 12, and is fixed to the glass epoxy substrate 12 with a fluorescent material containing layer 21 applied to its back side. This light emitting diode element 20 is a blue light emitting element made of gallium nitride type compound semiconductor. As shown in FIG. 3, it has a structure in which an n-type semiconductor 23 and a p-type semiconductor 24 are grown on the top surface of a sapphire substrate 22. The n-type semiconductor 23 and the p-type semiconductor 24 are provided with electrodes 25 and 26, and connected to the topside electrodes 13 and 14 arranged on the above-mentioned glass epoxy substrate 12 with bonding wires 27 and 28 for blue luminescence.

On the other hand, the fluorescent material containing layer 21 arranged on the back side of the light emitting diode element 20 is composed of, as shown in FIG. 3, an appropriate amount of fluorescent material 30 uniformly dispersed into an adhesive 29 as a base. This is applied by print to the top surface of the glass epoxy substrate 12 with a predetermined thickness. With the light emitting diode element 20 placed thereon, the adhesive 29 is heat solidified to fix the back side of the light emitting diode element 20 to the top surface of the glass epoxy substrate 12. The firm adhesion obtained between the adhesive 29 and the glass epoxy substrate 12 prevents the fluorescent material containing layer 21 from coming off. Incidentally, a fluorescent material containing resin sheet composed of a fluorescent material kneaded into a resin material may be formed and this fluorescent material containing resin sheet may be pasted onto the top surface of the base as the fluorescent material containing layer.

The above-mentioned fluorescent material 30 is excited by luminescence energy from the light emitting diode element 20 to convert visible light of short wavelength into visible light of long wavelength. It is made of, for example, fluorescent substances such as an yttrium compound.

Accordingly, while the above-described light emitting diode element 20 emits blue light 31 upward, sideways, and downward from the interface surface between the n-type semiconductor 23 and the p-type semiconductor 24, the blue light 31 emitted downward in particular impinges the fluorescent material 30 dispersed in the fluorescent material 30 so that it is converted in wavelength into yellow light 32 and emitted in all directions. Then, this yellow light 32 blends with the blue light 31 that is emitted upward and sideways from the above-mentioned light emitting diode element 20, so as to present white luminescence when the light emitting diode 11 is seen.

The surface side of the above-described light emitting diode element 20 is protected by a resin seal member 33 of rectangular solid shape, through which the aforementioned blue light 31 and wavelength-converted yellow light 32 travel straight ahead. Since it is chiefly composed of an epoxy type transparent resin and has no fluorescent material dispersed therein as distinct from heretofore, this resin seal member 33 is favorable in light transmittance, consequently achieving an improvement in the intensity of the white luminescence blended. Moreover, in this embodiment, the fluorescent material 30 is dispersed into the adhesive 29. Therefore, in contrast to the conventional cases where fluorescent materials are dispersed into resin seal members the fluorescent material 30 produces no deviation in dispersion so that variations in chromaticity is suppressed during light emission. Furthermore, in this embodiment, the fluorescent material containing layer 21 is far off the top surface of the resin seal member 33 and is hidden in the back side of the light emitting diode element 20. This means a structure less prone to effect of ultraviolet rays. Incidentally, dispersing agents such as silicon dioxide may be mixed into the resin seal member 33 for more uniform luminescence.

Figure 4:
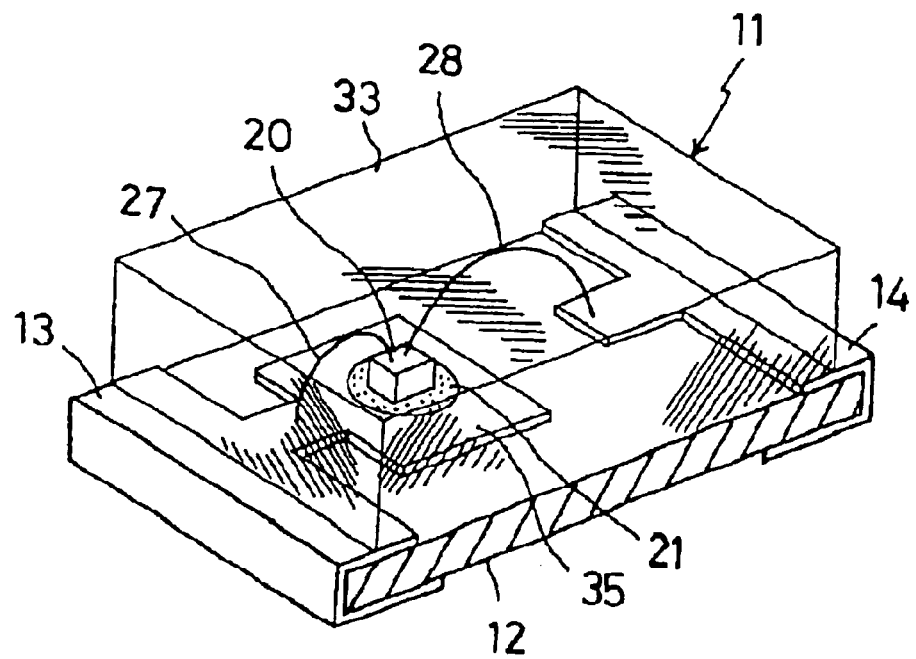
FIG. 4 is a perspective view of the light emitting diode with the light emitting diode element placed on the cathode electrode.

The reflection efficiency of the light emitted backward from the light emitting diode element 20 can also be improved by providing a thin film layer of high reflectivity such as copper foil and aluminum foil on the bottom side of the fluorescent material containing layer 21 described above, or by extending, as shown in FIG. 4, one topside electrode (cathode electrode) 13 to form a mounting surface 35 and fixing the light emitting diode element 20 onto this mounting surface 35 via the fluorescent material containing layer 21.

Figure 5:
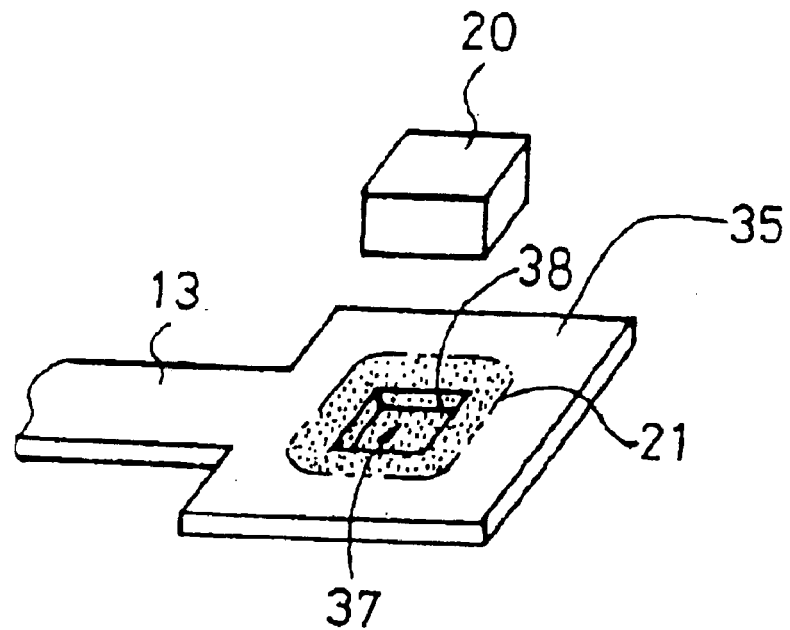
FIG. 5 is a perspective view showing a part of the cathode electrode provided with a dam, in a second embodiment of the present invention.
Figure 6:
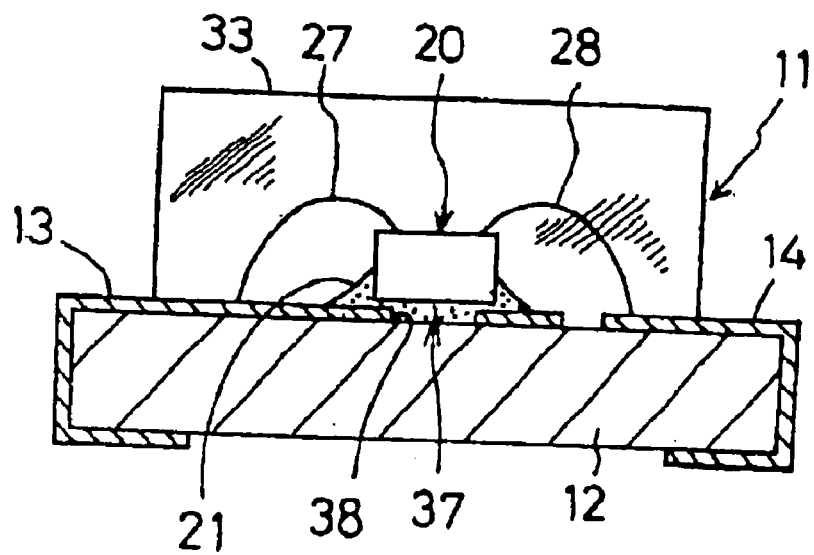
FIG. 6 is a sectional view of the light emitting diode according to the second embodiment mentioned above.

FIGS. 5 and 6 show the second embodiment of the present invention. In this embodiment, a rectangular hole 37 somewhat smaller than the plane shape of the light emitting diode element 20 is formed in the mounting surface 35 extended from the above-described topside electrode 13. This rectangular hole 37 is filled with the above-described fluorescent material containing layer 21, and the light emitting diode element 20 is placed on and fixed to the same. The other configurations are identical to those of the first embodiment described above. In this embodiment, when the fluorescent material containing layer 21 is filled into this rectangular hole 37, the inner rim of the rectangular hole 37 functions as a dam 38 to prevent the fluorescent material containing layer 21 from flowing away. This ensures a predetermined thickness as well as secures a uniform thickness under the entire bottom surface of the light emitting diode element 20. Incidentally, the dam 38 for ensuring a predetermined thickness is not limited to the mounting surface 35 which forms a part of the topside electrode 13 mentioned above.

Figure 7:
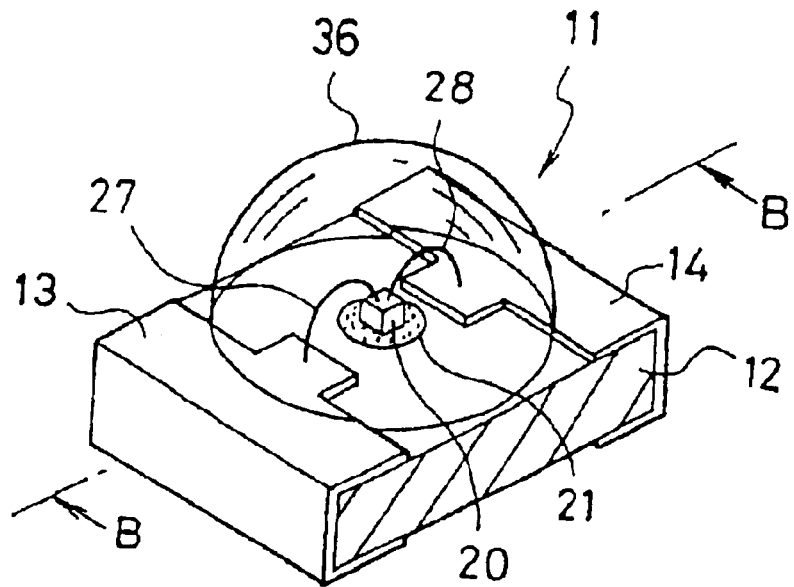
FIG. 7 is a perspective view of the light emitting diode showing a third embodiment of the present invention in which a lens portion of convex shape is formed on the seal resin member.
Figure 8:
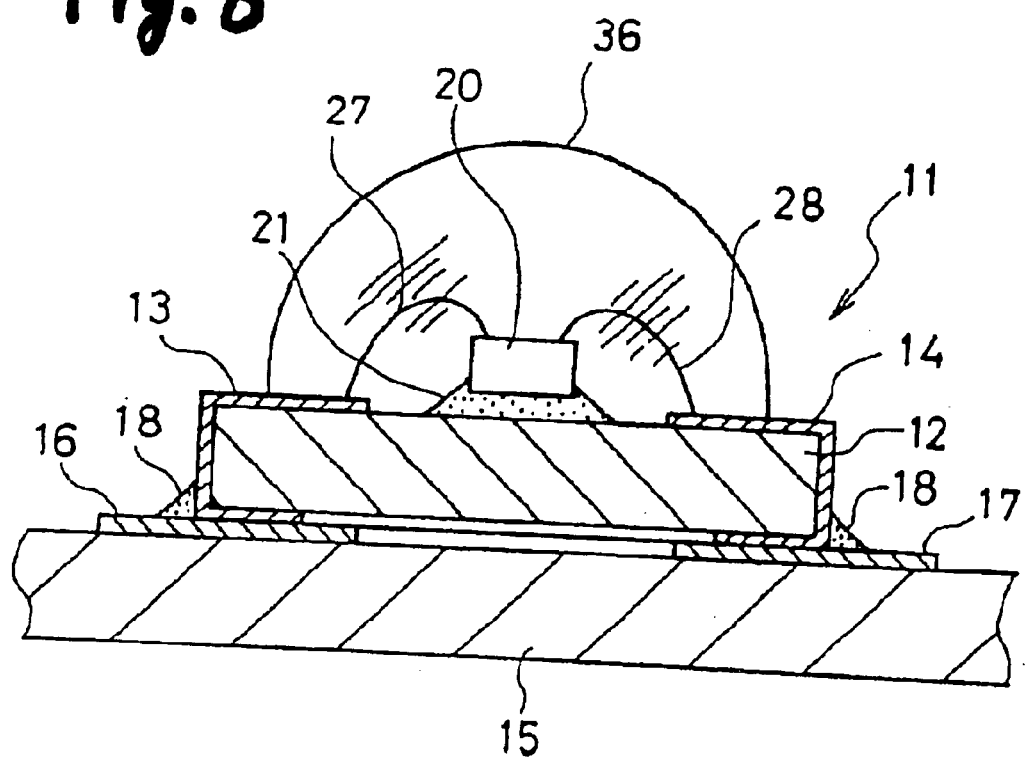
FIG. 8 is a sectional view along the line B—B in FIG. 7, at motherboard mounting.

FIGS. 7 and 8 show the third embodiment of the present invention. In this embodiment, the resin seal member 36 for protecting the surface side of the light emitting diode element 20 is formed in a hemispherical shape, functioning as a lens portion of convex shape to enhance the upward light-gathering power. That is, light traveling straight through the resin seal member 36 is refracted upward at the interface surface so that the enhanced light-gathering power achieves an improvement in the intensity of white luminescence.

Figure 9:
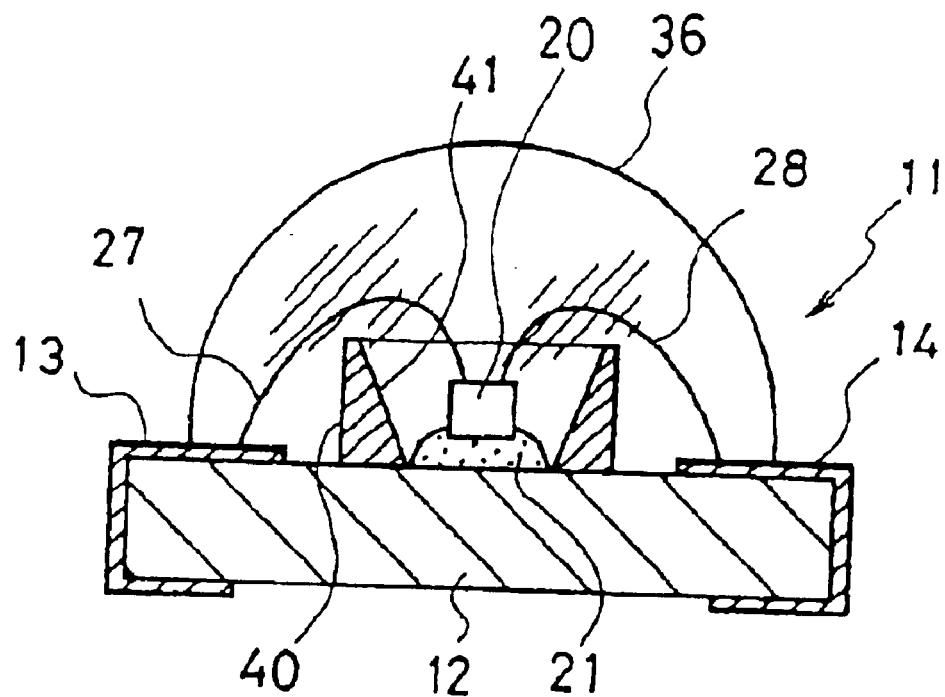
FIG. 9 is a perspective view of the light emitting diode showing a fourth embodiment of the present invention in which a reflecting frame is arranged around the light emitting diode element.

FIG. 9 shows the fourth embodiment of the present invention. In this embodiment, a cylindrical reflecting frame 40 is arranged at the topside center of glass epoxy substrate 12. A light emitting diode element 20 is placed therein, and the surface side of this light emitting diode element 20 is protected by a hemispherical resin seal member 36 as in the third embodiment described above. The reflecting frame 40 forms an upward reflecting surface of tapered shape, with an inner peripheral wall 41 tilting outward, so that the light emitted from the light emitting diode element 20 is reflected by the inner peripheral wall 41 for upward condensation. As in FIG. 3 described above, the light emitting diode element 20 is fixed to the top surface of the glass epoxy substrate 12 through the medium of a fluorescent material containing layer 21 having a fluorescent material 30 dispersed into an adhesive 29. When the fluorescent material containing layer 21 is arranged, the lower peripheral edge of the inner peripheral wall 41 of the reflecting frame 40 can make a dam to prevent the fluorescent material containing layer 21 from flowing away, so as to ensure a predetermined layer thickness.

Figure 10:
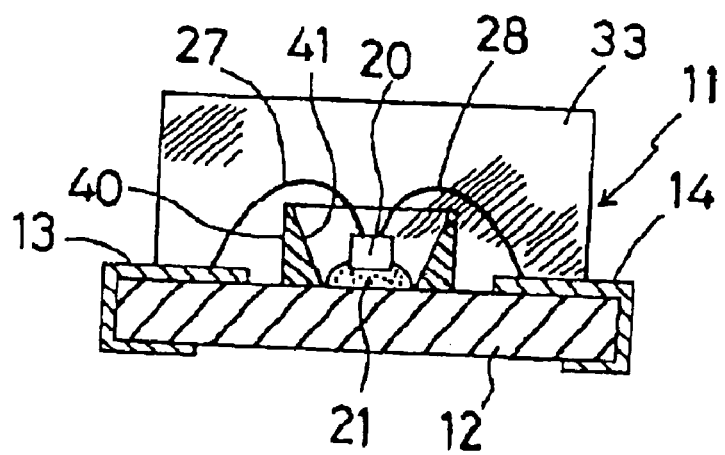
FIG. 10 is a sectional view of the light emitting diode made of a rectangular-solid resin seal member in the fourth embodiment mentioned above.

Therefore, according to this embodiment, the light emitted backward from the light emitting diode element 20 excites the fluorescent material 30 dispersed in the fluorescent material containing layer 21, and the light that is converted in wavelength by this excitation is reflected by the inner peripheral wall 41 of the reflecting frame 40 for upward condensation. Thus, both the reflected light condensed by the reflecting frame 40 and the light that travels directly through the resin seal member 36 from the light emitting diode element 20 are further condensed upward at the interface surface of the resin seal member 36. On this account, white luminescence of higher intensity as compared with the above-described embodiment is obtained. Incidentally, as shown in FIG. 10, the same reflecting frame 40 as described above may be provided in a resin seal member 33 of rectangular solid shape. In that case, the light gathering effect is obtained from the reflecting frame 40 alone.

Figure 11:
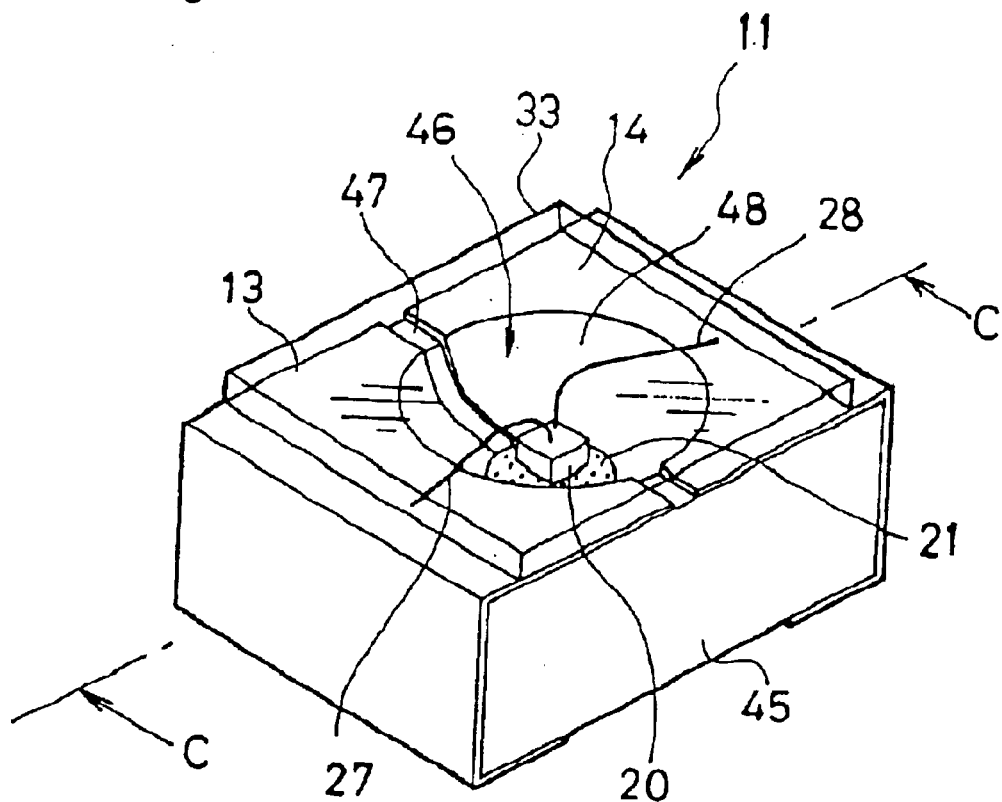
FIG. 11 is a perspective view of the light emitting diode showing the fifth embodiment of the present invention which uses a solid-molded substrate.
Figure 12:
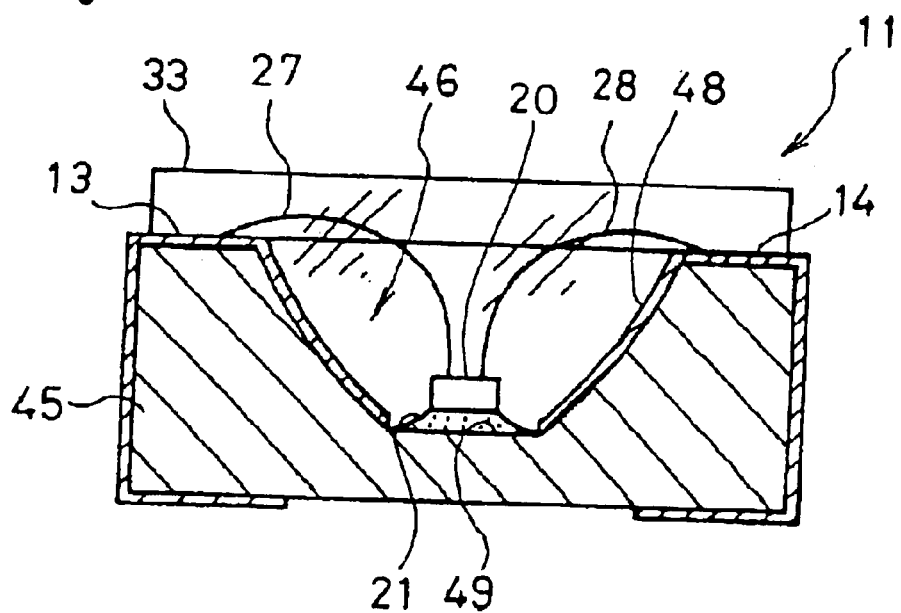
FIG. 12 is a sectional view along the line C—C in FIG. 11 mentioned above.

FIGS. 11 and 12 show the fifth embodiment of the present invention. The light emitting diode 11 according to this embodiment uses as its base a solid-molded substrate 45 molded of a liquid crystal polymer. A bowl-shaped cup portion 46 is formed in the center of the solid-molded substrate 45. A cathode and an anode, or topside electrodes, 13 and 14 are formed on the top surface of the solid-molded substrate 45 to the right and left astride a slit 47 in the center. On the inner periphery of the above-mentioned cup portion 46 are formed a reflecting surface 48 which is integrally molded with the topside electrodes 13 and 14 mentioned above. This reflecting surface 48 is hollowed round at the bottom 49 of the cup portion 46, so that the solid-molded substrate 45 is seen directly. Then, the same fluorescent material containing layer 21 as described above is applied to this bottom 49, and the light emitting diode element 20 is placed on and fixed to the same. Incidentally, a pair of electrodes of the light emitting diode element 20 and the above-mentioned topside electrodes 13 and 14 are connected with each other using bonding wires 27 and 28. Even in this embodiment, when the fluorescent material containing layer is arranged in this embodiment, the lower peripheral edge of the reflecting surface 48 makes a dam to prevent the fluorescent material containing layer 21 from flowing away, so as to ensure a predetermined layer thickness.

In addition, the above-mentioned light emitting diode element 20 and the bonding wires 27 and 28 are protected by a transparent resin seal member 33 which is formed on the top side of the solid-molded substrate 45, including the cup portion 46. In this embodiment, the thickness of the resin seal member 33 projecting to the top side of the solid-molded substrate 45 is suppressed, so that the light emitting diode 11 becomes low in profile as a whole. Incidentally, underside electrodes integrally molded with the above-mentioned topside electrodes 13 and 14 are formed on the bottom side of the solid-molded substrate 45.

Therefore, even in this embodiment, the light emitted backward from the light emitting diode element 20 excites the fluorescent material 30 dispersed in the fluorescent material containing layer 21. The light that is converted in wavelength by this excitation is reflected by the reflecting surface 48 of the cup portion 46 so that it travels upward to enhance the light-gathering power, presenting white luminescence of high intensity.

Figure 13:
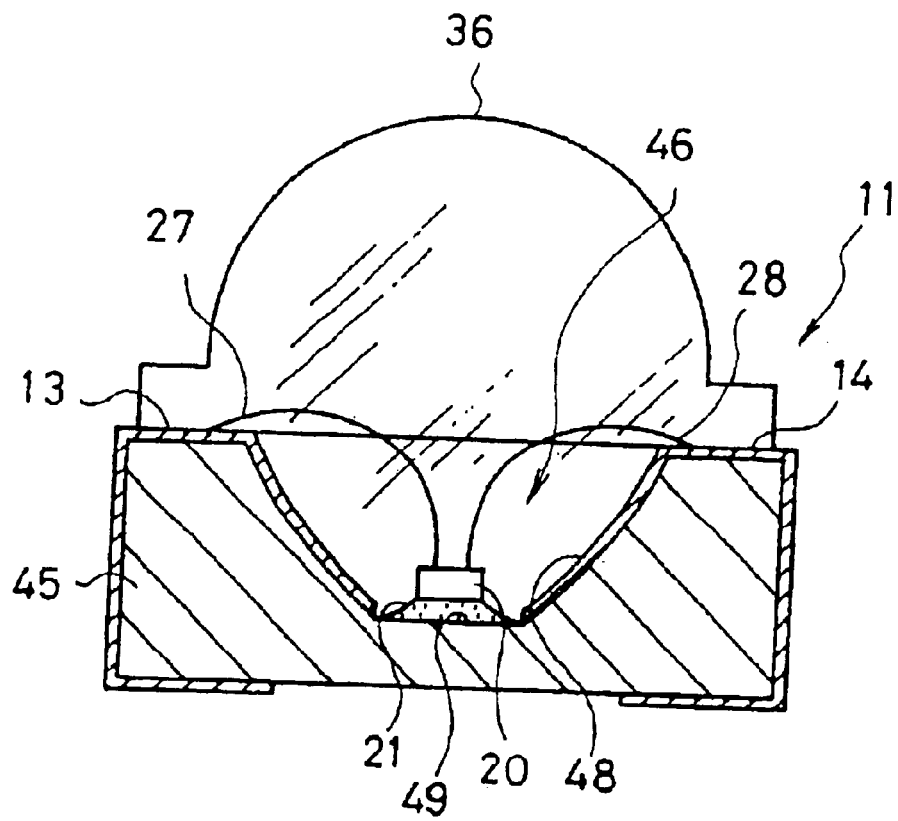
FIG. 13 is a sectional view of a light emitting diode showing a sixth embodiment of the present invention which uses a solid-molded substrate.

FIG. 13 shows the sixth embodiment of the present invention. The light emitting diode 11 according to this embodiment uses a solid-molded substrate 45 as in the fifth embodiment described above, but differs in that the resin seal member 36 for sealing the surface side of the light emitting diode element 20 is formed in a hemispherical shape. The top of the resin seal member 36 can be positioned generally right above the light emitting diode element 20 to enhance the light-gathering power. Therefore, the light-gathering power from the resin seal member 36 can be expected in addition to the light-gathering effect by the reflecting surface 48 of the cup portion 46, whereby white luminescence of yet higher intensity can be obtained.

Figure 14:
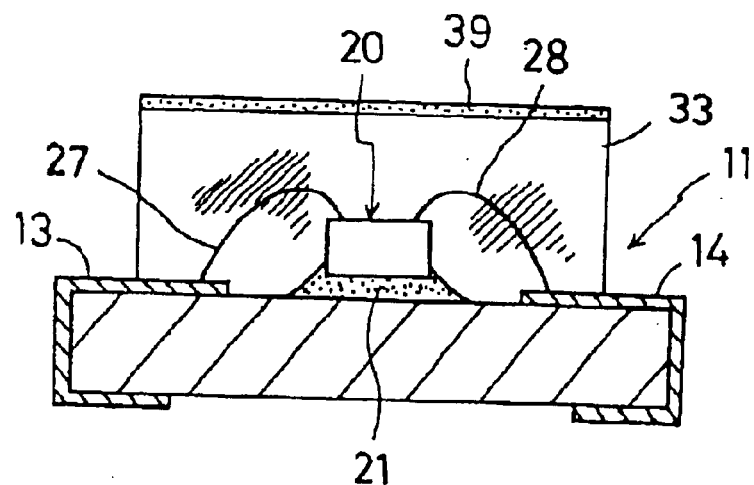
FIG. 14 is a sectional view of a light emitting diode showing a seventh embodiment of the present invention in which a fluorescent material containing layer is formed on the topside of the seal resin member.

FIG. 14 shows the seventh embodiment of the present invention. In this embodiment, a fluorescent material containing layer 39 is formed thinly on the top side of a rectangular-solid-shaped resin seal member 33 so as to allow color adjustment on the top surface. The fluorescent material containing layer 39 is composed of a fluorescent material 30 of the above-mentioned yttrium type or a different fluorescent material, dispersed into an organic solvent. It may be printed as paint on the top surface of the resin seal member 33, or formed into a sheet and pasted. The fluorescent material containing layer 39 is formed thinly, which makes it possible to minimize a drop in light transmittance in the resin seal member 33.

Figure 15:
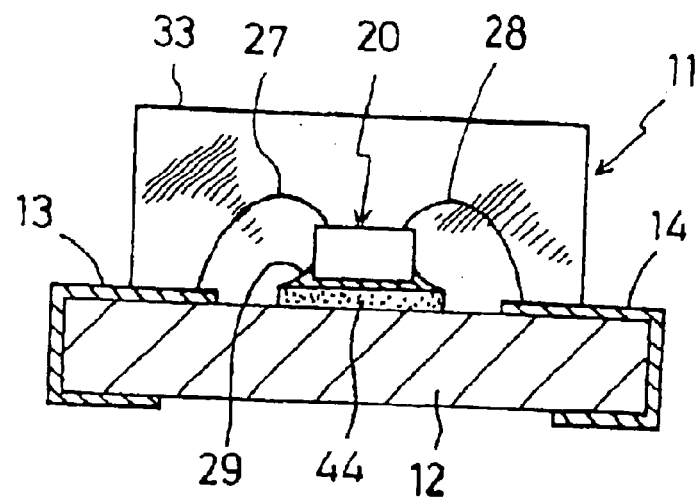
FIG. 15 is a sectional view of the light emitting diode showing an eighth embodiment of the present invention in which the fluorescent material and the adhesive in the fluorescent material containing layer are separated.

FIG. 15 shows the eighth embodiment of the present invention. In contrast to the embodiments described above, the adhesive 29 and the fluorescent material 30 are separated from each other. A fluorescent material containing resin 44 having the above-mentioned fluorescent material 30 dispersed into a transparent organic solvent is applied by print to the top surface of a glass epoxy substrate 12, and formed into a predetermined thickness through overprinting or the like. The fluorescent material containing resin 44 is dried before a transparent adhesive 29 is applied thereon to have a double-layer structure. A light emitting diode element 20 is placed on and fixed to the same. In this embodiment, the blue luminescence emitted backward from the light emitting diode element 20 passes through the adhesive 29 and then impinges on the fluorescent material 30 dispersed in the fluorescent material containing resin 44 to excite the fluorescent material 30, so that it is converted in wavelength into yellow luminescence and emitted in all direction. Since the fluorescent material containing resin 44 is capable of securing a greater thickness and is easy to adjust in thickness, there is a merit that the degree of blend with blue luminescence is easily adjustable. Incidentally, aside from the above-described fluorescent material containing resin, it can also be formed by pasting a fluorescent material containing sheet.

Figure 16:
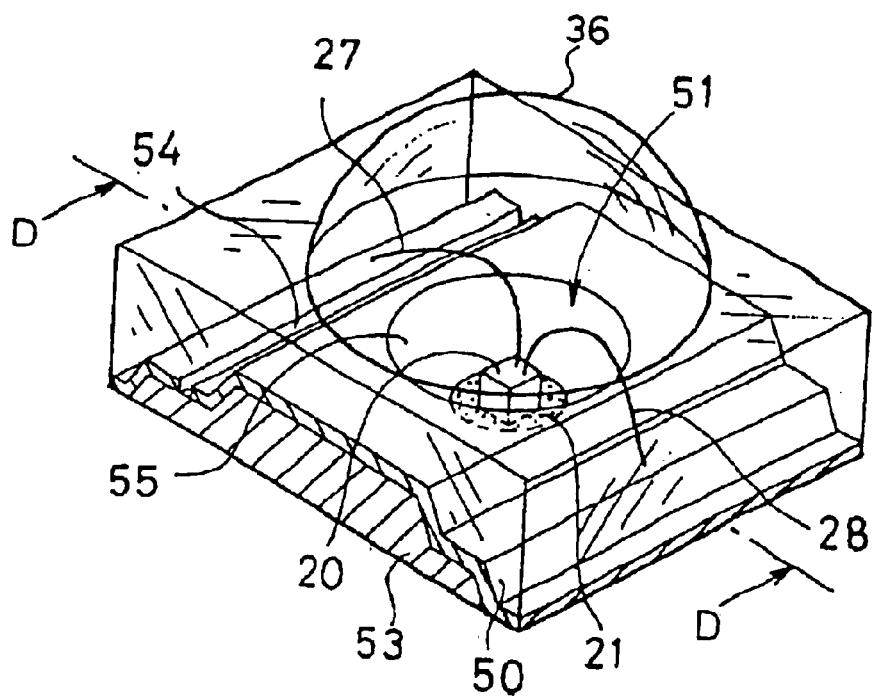
FIG. 16 is a perspective view of a light emitting diode showing a ninth embodiment of the present invention which uses a sheet metal substrate.
Figure 17:
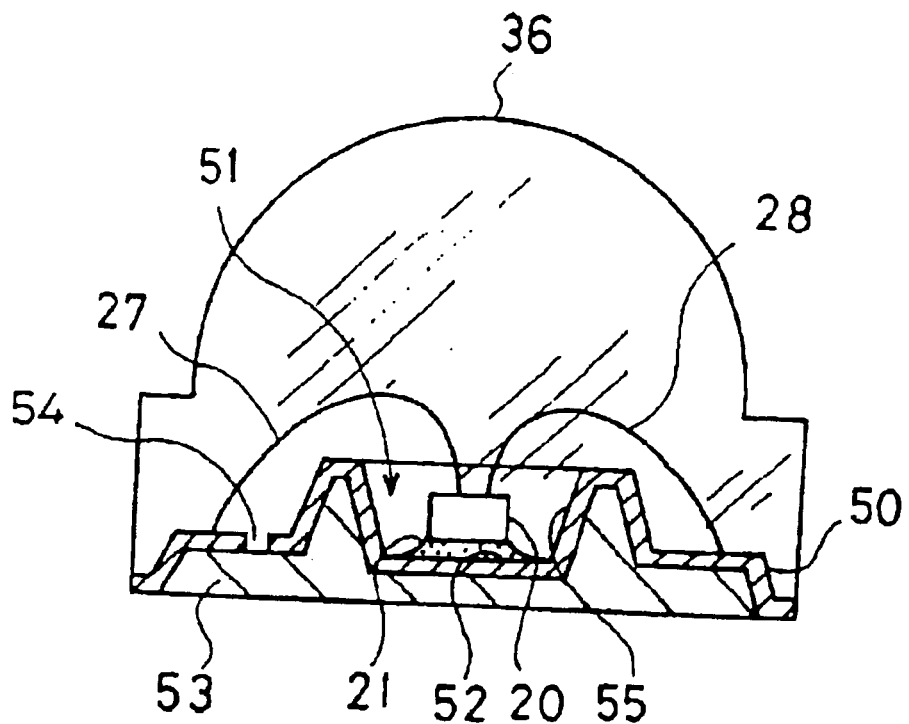
FIG. 17 is a sectional view along the line D—D in FIG. 16 mentioned above.

FIGS. 16 and 17 show the ninth embodiment of the present invention, in which a sheet metal substrate 50 pressed into a predetermined shape is used as the base, instead of the glass epoxy substrate 12 described above. This sheet metal substrate 50 is made of a material of favorable thermal conductivity, such as copper, iron, or phosphorus bronze. A cup portion 51 of bowl shape is press-formed in the center. As in the first embodiment described above, the bottom surface 52 of the cup portion 51 is provided with a fluorescent material containing layer 21 having a fluorescent material 30 dispersed into an adhesive 29, onto which is fixed a light emitting diode element 20. In this embodiment, because the fluorescent material containing layer 21 is applied directly onto the sheet metal substrate 50, an insulating property is required of the adhesive 29. Besides, in this embodiment, epoxy resin 53 is filled into the recesses at the back side of the sheet metal substrate 50 in order to secure the rigidity of the substrate. A splitting slit 54 is formed in one end of the sheet metal substrate 50 so that the right and left splits of the sheet metal substrate 50 themselves form a pair of topside electrodes.

Thus, connecting both electrodes of the light emitting diode element 20 and the right and left top surfaces of the sheet metal substrate 50 with each other using bonding wires 27 and 28 can establish conduction to the light emitting diode element 20. The inner peripheral wall of the above-mentioned cup portion 51 forms a reflecting surface 55 of tapered shape, and is combined with a hemispherical resin seal member 36 for sealing the surface side of the light emitting diode element 20 to enhance the light-gathering power. Incidentally, even in this embodiment, the lower peripheral edge of the reflecting surface 55 functions as a dam for securing the thickness of the fluorescent material containing layer 21.

Figure 18:
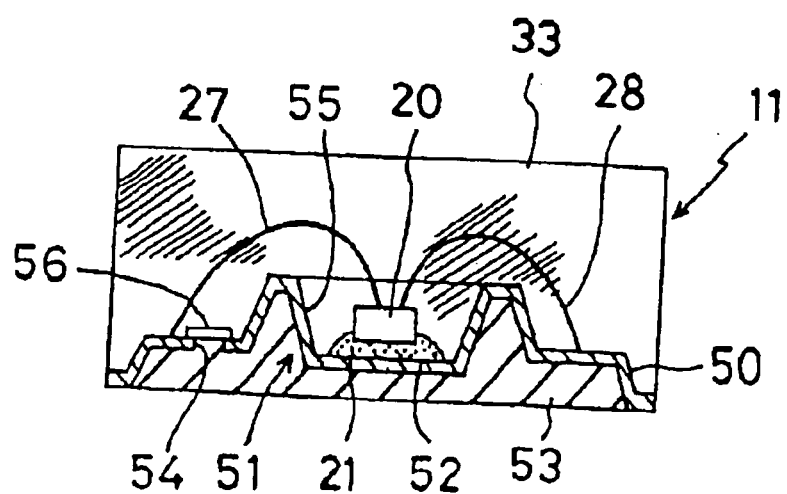
FIG. 18 is a sectional view of a light emitting diode showing another embodiment which uses a solid-molded substrate.

The light emitting diode 11 using the sheet metal substrate 50 may also be provided with a resin seal member 33 of rectangular solid shape with a flat top surface, as shown in FIG. 18. In this case the splitting slit 54 is stopped by an insulating tape 56.

Figure 19:
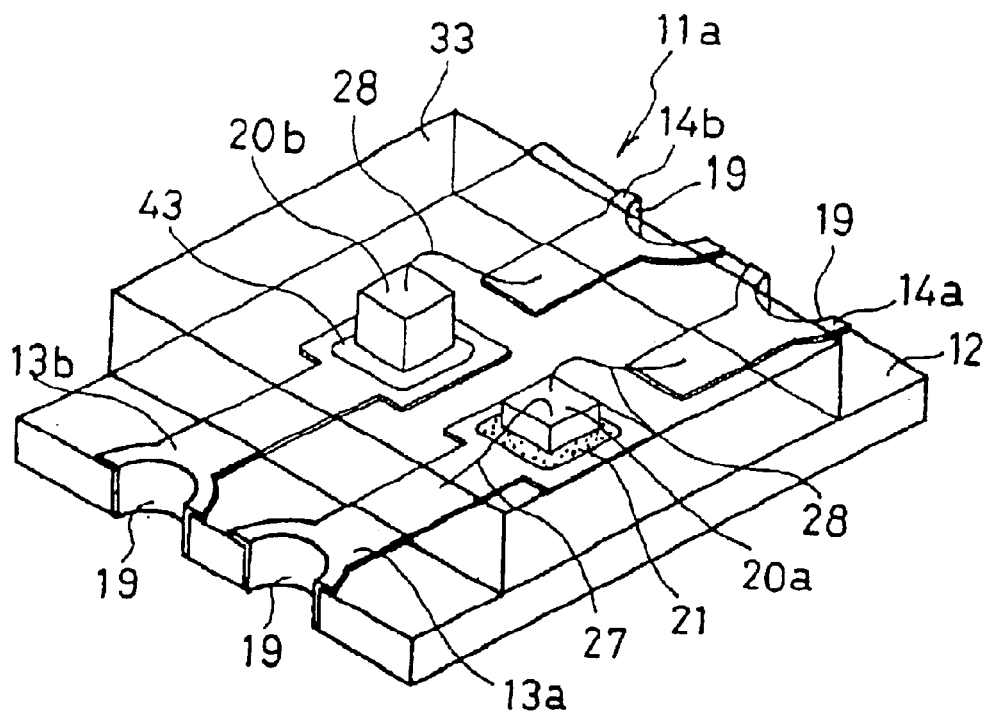
FIG. 19 is a perspective view of a multicolor light emitting diode showing a tenth embodiment of the present invention.

FIG. 19 shows the tenth embodiment of the present invention. This embodiment of application to the multicolor light emitting diode 11a has a structure in which cathode electrodes 13a, 13b and anode electrodes 14a, 14b are patterned in right left rows on the top surface of a rectangular glass epoxy substrate 12 to be the base, and the underside electrodes pass around behind via their respective through holes 19.

A first light emitting diode element 20a and a second light emitting diode element 20b are mounted on the pair of cathode electrodes 13a and 13b formed on the top surface of the above-mentioned glass epoxy substrate 12, respectively. The first light emitting diode element 20a is a blue light emitting element made of the gallium nitride type compound semiconductor described above, and is connected to the above-mentioned cathode electrode 13a and anode electrode 14a with bonding wires 27 and 28.

Moreover, the first light emitting diode element 20a is adhesive bonded to the top surface of the cathode electrode 13a via a fluorescent material containing layer 21 arranged on its back side. This fluorescent material containing layer 21, as described above, is composed of an insulative adhesive as the base and an appropriate amount of fluorescent material uniformly dispersed into the same. This is applied to the top surface of the cathode electrode 13a with a predetermined thickness. With the light emitting diode element 20a placed thereon, the adhesive is heat solidified to fix the back surface of the first light emitting diode element 20a to the top surface of the cathode electrode 13a.

Meanwhile, the second light emitting diode element 20b is a red light emitting diode element made of a gallium aluminum indium phosphide type compound semiconductor (GaAlInP). It is fixed onto the cathode electrode 13b via a conductive adhesive 43 and is connected to the anode electrode 14b with a bonding wire 28.

In addition, the light emitting diode elements 20q and 20b arranged in a row on the top surface of the glass epoxy substrate 12 are protected at the surface side by a transparent resin seal member 33. This resin seal member 33 is composed chiefly of epoxy resin, and formed in a rectangular solid shape over the top side of the glass epoxy substrate 12 except the individual through holes 19 in the above-described cathode electrodes 13a, 13b and anode electrode 14a, 14b.

Thus, in the multicolor light emitting diode 11a of the embodiment described above, the current flow through the first light emitting diode element 20a produces, as shown in FIG. 3 cited before, blue luminescence at the interface surface between the n-type semiconductor 23 and the p-type semiconductor 24. This blue luminescence is emitted upward, sideways, and downward as blue light 31. In particular, the blue light 31 emitted downward excites the fluorescent material 30 dispersed into the fluorescent material containing layer 21,undergoes wavelength conversion, and is emitted in all directions as yellow light 32. Then, this yellow light 32 blends with the blue light 31 emitted upward and sideways from the above-mentioned first light emitting diode element 20a so as to be recognized as white luminescence when the multicolor light emitting diode 11a is seen. The surface side of the first light emitting diode element 20a is protected by the resin seal member 33 of rectangular solid shape, through which the aforementioned blue light 31 and wavelength-converted yellow light 32 travel straight ahead. Since it is chiefly composed of an epoxy type transparent resin and includes no fluorescent material as distinct from heretofore, this resin seal member 33 is favorable in light transmittance, consequently achieving an improvement in the intensity of the white luminescence. Besides, in this embodiment, white luminescence can be obtained simply by passing a current through the first light emitting diode element 20a. This means significantly lower current consumption as compared with the conventional cases where a plurality of lights emitted from light emitting diode elements are blended to obtain white luminescence.

Meanwhile, red luminescence can be obtained by passing a current through the second light emitting diode element 20b. Since the resin seal member 33 is transparent, red luminescence of high intensity can be obtained without any drop in light transmittance.

Figure 20:
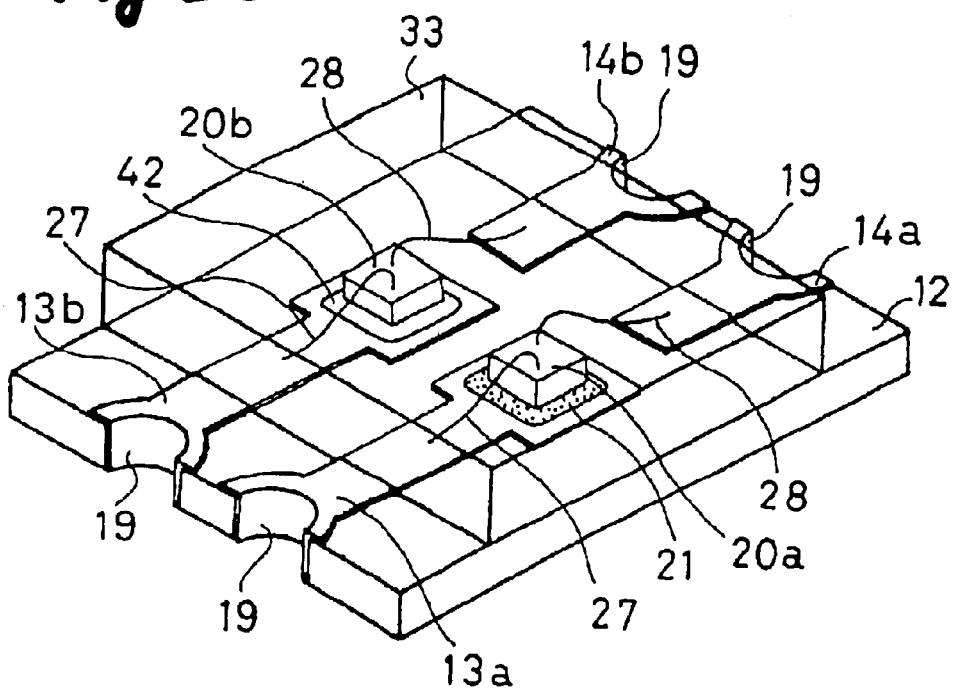
FIG. 20 is a perspective view of a multicolor light emitting diode showing an eleventh embodiment of the present invention.

FIG. 20 shows the eleventh embodiment of the present invention, in which the second light emitting diode element 20b for red luminescence in the foregoing embodiment is replaced by one for blue luminescence and is placed on the cathode electrode 13b. This blue light emitting diode element 20b is made of the same gallium nitride type compound semiconductor as the first light emitting diode element 20a. It is thud fixed on the top surface of the cathode electrode 13b via an insulative adhesive 42 and is put into conduction with the cathode electrode 13b and the anode electrode 14b by bonding wires 27 and 28, respectively. Incidentally, since the other configurations are identical to those of the tenth embodiment described above, detailed description thereof will be omitted.

In this embodiment, the first light emitting diode element 20a presents white luminescence as in the foregoing embodiment, whereas the second light emitting diode element 20b produces blue luminescence when a current is supplied thereto. In this way, blue and white, two-color luminescence can be easily obtained despite the mounting of the precisely identical light emitting diode elements.

Figure 21:
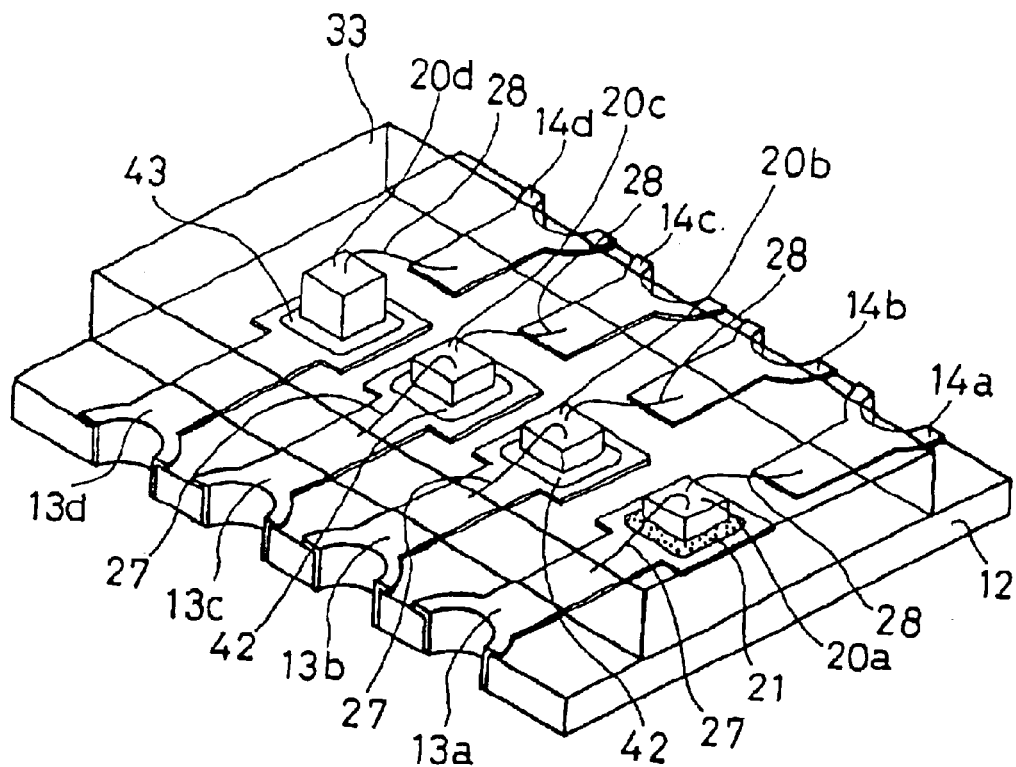
FIG. 21 is a perspective view of a multicolor light emitting diode showing a twelfth embodiment of the present invention.
Figure 22:
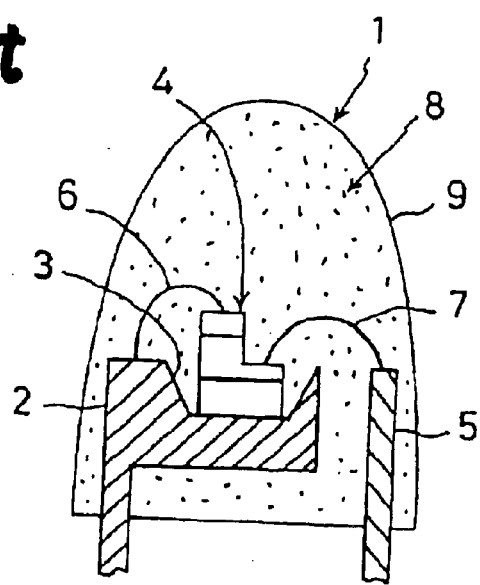
FIG. 22 is a sectional view showing an example of a conventional wavelength-conversion type light emitting diode.
Figure 23:
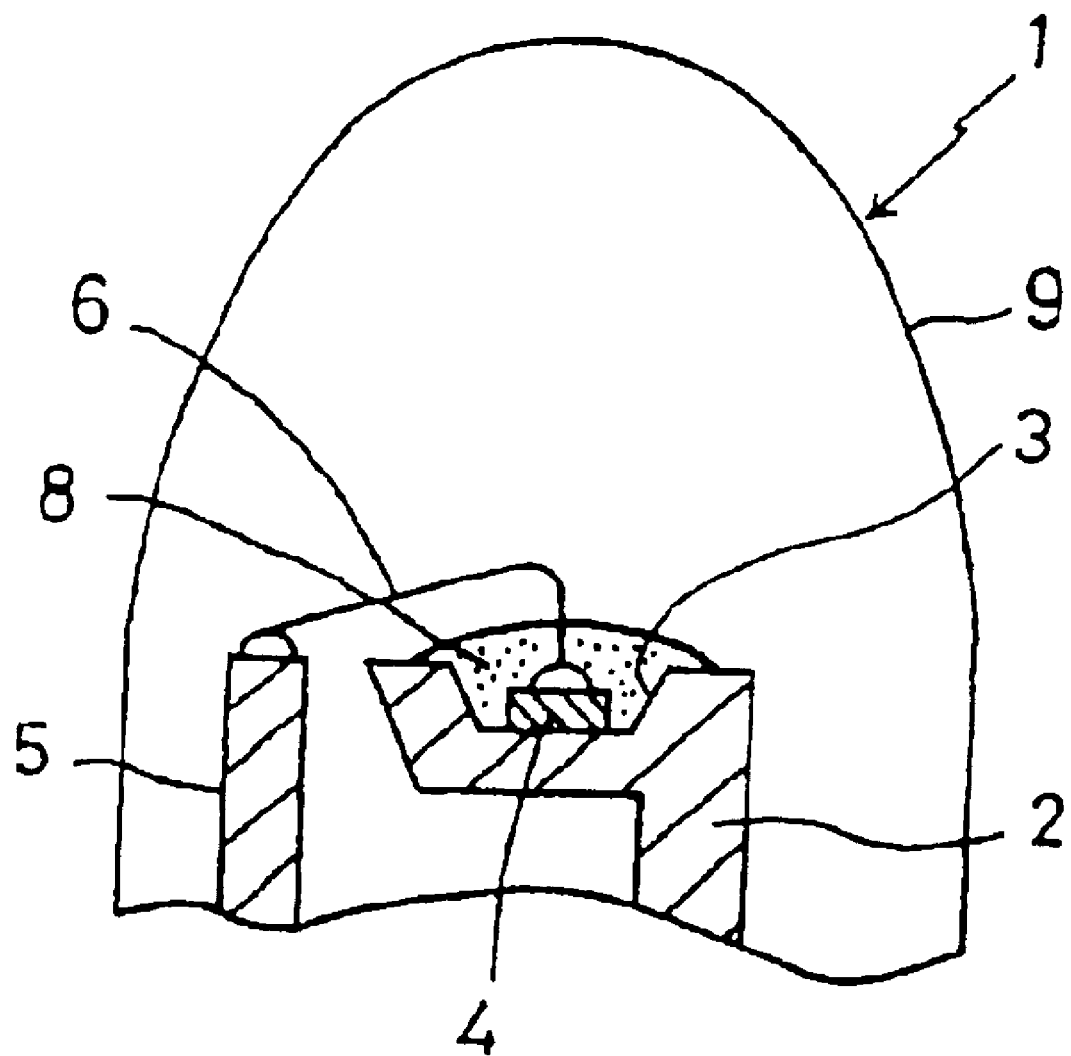
FIG. 23 is a sectional view showing another example of a conventional wavelength-conversion type light emitting diode.

FIG. 21 shows the twelfth embodiment of the present invention. The multicolor light emitting diode according to this embodiment is of full color and, as distinct from heretofore, can produce every color with its four light emitting diode elements. That is, in this configuration, white luminescence is emitted by a first light emitting diode element 20a, and all the colors other than white are displayed by combinations of second, third, and fourth light emitting diode elements 20b, 20c, and 20d. Cathode electrodes 13a–13d and anode electrodes 14a–14d are formed in four rows on a oblong glass epoxy substrate 12, and the first through fourth light emitting diode elements 20a–10d are mounted on the cathode electrodes 13a–13d in succession. In this embodiment, the first through fourth light emitting diode elements for white, green, blue, and red, respectively. The first to third light emitting diodes 20a, 20b and 20c each are made of gallium nitride type compound semiconductor. The fourth light emitting diode element 20d is made of a gallium aluminum indium phosphide type compound semiconductor.

The first light emitting diode 20a mentioned above is fixed to the top surface of the cathode electrode 13a with a fluorescent material containing layer 21. The second and third light emitting diode elements 20b and 20d are fixed to the top surfaces of the cathode electrodes 13b and 13c with an insulative adhesive 42. Besides, the fourth light emitting diode element 20d is fixed to the top surface of the cathode electrode 13d with a conductive adhesive 43. Incidentally, the first to third light emitting diode elements 20a, 20b, and 20c are connected to the respective cathode electrodes 13a, 13b, and 13c by bonding wires 27. Including the fourth light emitting diode element 20d, they are connected to the anode electrodes 14a, 14b, 14c and 14d by bonding wires 28. Above the first through fourth light emitting diode elements 20a–20d is provided a protection by an integrally-formed resin seal member 33 of rectangular solid shape.

Accordingly, in this embodiment, the individual light emitting diode elements 20a, 20b, 20c, and 20d not only can emit monochromatic luminescence, but the values of the currents to the second through the fourth light emitting diode elements 20b, 20c and 20d for green, blue, and red luminescence can be controlled to produce luminescence of any color as well. Moreover, white luminescence can be obtained by making the first luminescence. This eliminated the need for delicate current control as in conventional full-color light emitting diodes.

Incidentally, while any of the above-described embodiments has dealt with a light emitting diode of chip type which is surface-mounted directly on the printed wires 16 and 17 on a motherboard 15 as shown in FIG. 2, the light emitting diodes of this invention may also be applied to the lead-fram types described in the conventional examples. That is, an adhesive that contains a fluorescent material can be applied to recesses in the metal stems to mount light emitting diode elements on, and light emitting diode elements made of gallium nitride type compound semiconductor can be fixed onto the same so that white luminescence of high intensity is obtained without the fluorescent material being dispersed into resin sea members of bombshell form.

Moreover, while the above-described embodiments each have dealt with the case where a light emitting diode element and a pair of topside electrodes are connected with each other using bonding wires, this invention is not limited thereto, and also covers such connection methods as flip chip mounting using solder bumps.

Furthermore, while the above-described embodiments each have dealt with the case where the light emitting diode element(s) is/are made of gallium nitride type compound semiconductor, the same configurations are also available in the cases of using light emitting diode elements for blue luminescence, formed of SiC type compound semiconductor.

INDUSTRIAL APPLICABILITY

As has been described, a light emitting diode according to the present invention can present white luminescence of high intensity, and thus is useful as a white light source in various types of display units or in optical communication.

Besides, a light emitting diode according to the present invention is useful as a multicolor light emitting diode that is low in current consumption and easy of current control.

What is claimed is:

1. A light emitting diode comprising:

A base;

A thin plate-like electrode mounted on the upper surface of the base;

A light emitting diode element fixed to the top surface of the thin plate-like electrode by an adhesive containing fluorescent material;

A resin seal member for sealing the upper surface of the light emitting diode element; and A recess formed by a portion of the upper surface of the base and by a hole provided in the thin plate-like electrode, said hole having a shape smaller than the shape of the bottom surface of the light emitting diode element;

Wherein the adhesive is filled into the recess and the bottom surface of the light emitting diode element is disposed on the adhesive so that the light emitting diode element is fixed to the thin plate-like electrode.

2. The light emitting diode according to claim 1 wherein a portion in which there is an overlap between the peripheral portion of the hole provided in the thin plate-like electrode and the outer peripheral portion of the bottom surface of the light emitting diode element disposed above the hole forms a reflecting surface of the bottom surface of the light emitting diode element.

3. The light emitting diode according to claim 1 wherein more than two light emitting diode elements are positioned on the base;

At least one of the plurality of light emitting diode elements being a blue light emitting diode element made of gallium nitride semiconductor or a silicon carbide semiconductor;

A recess formed by a portion of the upper surface of the base and by a hole provided in the thin plate-like electrode facing the bottom surface of the blue light emitting diode element, said hole having a shape smaller than the shape of the bottom surface of the blue light emitting diode element;

Wherein the adhesive containing fluorescent material is filled into the recess and the blue light emitting diode element is disposed on the adhesive and fixed.

* * * * *